United States Patent
Takamatsu et al.

(10) Patent No.: US 6,558,990 B1
(45) Date of Patent: May 6, 2003

(54) SOI SUBSTRATE, METHOD OF MANUFACTURE THEREOF, AND SEMICONDUCTOR DEVICE USING SOI SUBSTRATE

(75) Inventors: Masaru Takamatsu, Tokyo (JP); Takashi Katakura, Tokyo (JP); Toshiaki Iwamatsu, Tokyo (JP); Hideki Naruoka, Tokyo (JP)

(73) Assignees: Mitsubishi Materials Silicon Corporation, Tokyo (JP); Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/786,228

(22) PCT Filed: Jun. 30, 2000

(86) PCT No.: PCT/JP00/04376

§ 371 (c)(1),
(2), (4) Date: Mar. 1, 2001

(87) PCT Pub. No.: WO01/03191

PCT Pub. Date: Jan. 11, 2001

(30) Foreign Application Priority Data

Jul. 2, 1999 (JP) ............................................. 11-189100

(51) Int. Cl.$^7$ ................................................ H01L 21/00
(52) U.S. Cl. ........................ 438/151; 438/62; 438/406; 438/455; 438/458
(58) Field of Search ................................ 438/455, 458, 438/406, 151, 62

(56) References Cited

U.S. PATENT DOCUMENTS 5,034,335 A * 7/1991 Widdershoven .............. 437/26
5,233,218 A * 8/1993 Miura ......................... 257/618
5,494,846 A   2/1996 Yamazaki .................... 437/62
5,512,501 A * 4/1996 Hidaka et al. ................ 437/41
5,780,888 A * 7/1998 Maeda et al. ............... 257/302
5,869,386 A   2/1999 Hamajima et al. .......... 438/455
6,022,765 A * 2/2000 Kim ........................... 438/151

FOREIGN PATENT DOCUMENTS

| JP | 63-312632 | 12/1988 |
| JP | 4-129267 | 4/1992 |
| JP | 5-259011 | 10/1993 |
| JP | 7-176608 | 7/1995 |
| JP | 9-153603 | 6/1997 |
| JP | 11-204452 | 7/1999 |

* cited by examiner

*Primary Examiner*—Richard Elms
*Assistant Examiner*—Pho M. Luu
(74) *Attorney, Agent, or Firm*—Reed Smith LLP

(57) ABSTRACT

A manufacturing method of a SOI substrate (10) comprises the steps of: forming an oxide film (12) at cross-sectional both main surfaces and cross-sectional both end surfaces of a silicon substrate (11); forming a resist layer (13) on the oxide film (12) at cross-sectional both end surfaces of the substrate (11); and removing the oxide film (12) at those portions which are left from the covering of the resist layer (13), to thereby expose the both main surfaces of the substrate (11). Next, the resist layer (13) is removed to thereby leave the oxide film (12) at the both end surfaces of the substrate (11); and oxygen ions (I) are dosed into the substrate (11) from one of the exposed both main surfaces, followed by an anneal processing to thereby form an oxide layer (14) in a region at a predetermined depth from the one main surface of the substrate (11). The oxide film (12) left on the both end surfaces of the substrate (11) is then removed.

13 Claims, 13 Drawing Sheets

Fig. 6
(a) 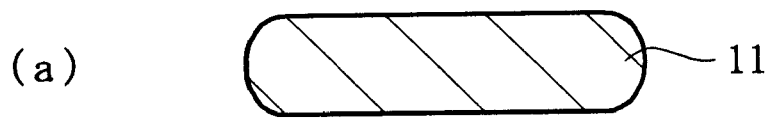
(b) 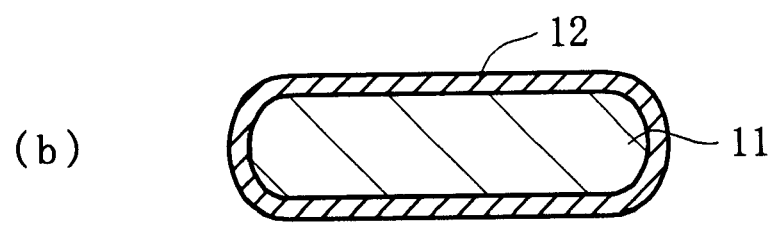
(c) 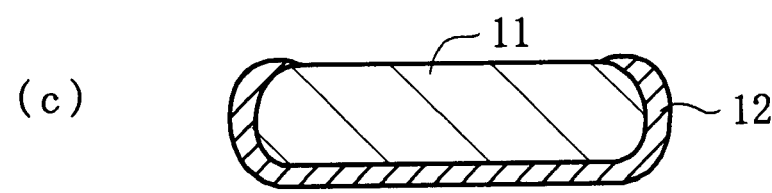
(d) 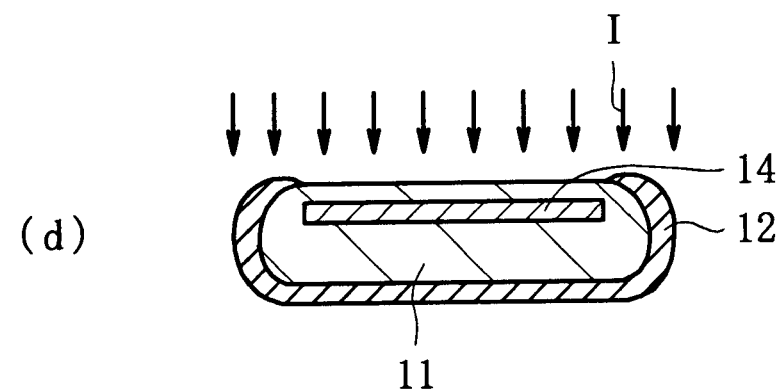
(e) 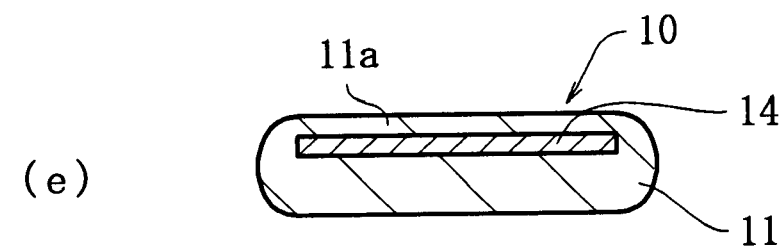

SOI SUBSTRATE, METHOD OF MANUFACTURE THEREOF, AND SEMICONDUCTOR DEVICE USING SOI SUBSTRATE

This application claims Paris Convention priority of Japanese Application No. Hei 11-189100 filed Jul. 2, 1999 and International Application No. PCT/JP00/04376 filed Jun. 30, 2000, the complete disclosure of which are hereby incorporated by reference.

TECHNICAL FIELD

The present invention relates to a SOI (Silicon-On-Insulator) substrate including a silicon substrate and an insulating layer buried in the silicon substrate, and to a manufacturing method therefor. More particularly, the present invention relates to a SOI substrate manufactured by a SIMOX (Separation by Implanted Oxygen) technique and a manufacturing method therefor, as well as a semiconductor device utilizing the SOI substrate.

BACKGROUND ART

The SIMOX method as one of SOI substrate manufacturing methods is to bury an insulating layer into a silicon substrate. Concretely, as shown in FIG. 8(a), the SOI substrate 1 is obtained by dosing oxygen ions at a higher concentration into a silicon substrate 2, and thereafter annealing the silicon substrate 2 at a higher temperature to thereby form a buried silicon oxide layer 3 in a region at a predetermined depth from the surface of the silicon substrate 2, in which a SOI layer 2a at the top surface side of the layer 3 is used as an active area.

However, cross-sectional end peripheries 3a, 3a of the buried silicon oxide layer 3 of the SOI substrate 1 are not buried within the substrate, and are exposed at substrate side surfaces. Thus, upon etching during a semiconductor device manufacturing process such as by a hydrofluoric acid aqueous solution, the exposed end peripheries 3a, 3a of the oxide layer 3 are removed by etching. As a result, those cross-sectional end surfaces 2b of the SOI layer 2a corresponding to an upper layer are brought into an overhung state like a canopy, as shown in FIG. 8(b). Since these overhung portions 2b, 2b have such a small thickness on the order of 0.05 to 0.3 $\mu$m, these portions are poor in mechanical strength and are chipped and/or peeled off during subsequent processes. Silicon fragments caused thereby become particles which adhere onto the surface of the SOI layer 2a as the active area. Devices formed on the SOI layer 2a having adhered particles lead to a cause of defects such as of patterning and in various deposition films, thereby problematically lowering a product yield.

As a SIMOX method to improve such a problem, there has been known a manufacturing method of a semiconductor substrate in which cross-sectional both end surfaces of a silicon substrate are coated by a resist, and oxygen ions are dosed from the exposed main surface of the silicon substrate into the interior of the silicon substrate to thereby form a buried silicon oxide layer within the silicon substrate (Japanese Patent Application Laid-Open No. HEI-129267 (129267/1992)).

In the manufacturing method of a semiconductor substrate according to the aforementioned conventional SIMOX method, however, ion dosing is performed in a state where the resist exists at both end surfaces. Thus, those ions having higher energies also impinge the resist constituted of organic matters containing impurities such as metals, so that those organic matters struck out from the resist upon ion dosing tend to spatter to thereby adhere onto the surface of the SOI layer as the active area. This leads to such a problem that the surface of the SOI layer as the active area is contaminated by impurities such as metals.

Meanwhile, silicon substrates are sometimes provided with marking characters thereon, for identifying the substrates themselves. Those marking characters are mainly provided by laser irradiation, and as shown in FIG. 2, marking characters 16a (such as "ABC-XYZ") are provided in a marking character area 16 at an end periphery of one of the main surfaces of a substrate 11. In manufacturing a SOI substrate 1 shown in FIG. 9(b) from a silicon substrate 2 provided with marking characters 4 as shown in FIG. 9(a), oxygen ions I are dosed into the interior of the silicon substrate 2 similarly to the aforementioned SIMOX method, followed by an anneal processing at a higher temperature so as to form a buried silicon oxide layer 3 in a region at a predetermined depth from the surface of the silicon substrate 2. The marking characters by laser irradiation generally reach a depth of about 1 $\mu$m from the substrate surface. Further, the buried silicon oxide layer is formed at a sub-micron depth from the substrate surface. Thus, when a SOI substrate is manufactured after providing marking characters at the end periphery of the main surface of the silicon substrate, or, when marking characters are provided at the end periphery of the main surface after the SOI substrate is manufactured in an unshown manner, the marking character portion and the buried oxide layer overlap with each other, thereby causing a problem of dust occurrence from the marking character portion.

It is therefore an object of the present invention to provide a manufacturing method of a SOI substrate, which prevents particles and impurities such as metals in a resist, from adhering onto a SOI layer as an active area, to thereby improve a product yield.

It is another object of the present invention to provide a manufacturing method of an SOI substrate for preventing dust occurrence due to marking characters.

It is yet another object of the present invention to provide a SOI substrate which noway causes dust occurrence due to marking characters.

It is still another object of the present invention to provide a semiconductor device adopting a SOI substrate having extremely lesser adherence such as of particles and impurities onto a SOI layer as an active area.

DISCLOSURE OF THE INVENTION

The invention of claim 1 as shown in FIG. 1 is a manufacturing method of a SOI substrate comprising the steps of: forming an oxide film 12 at cross-sectional both main surfaces and both end surfaces of a silicon substrate 11; forming a resist layer 13 on the oxide film 12 at cross-sectional both end surfaces of the substrate 11; removing the oxide film 12 at those portions which are left from the covering of the resist layer 13, to thereby expose the both main surfaces of the silicon substrate 11; removing the resist layer 13 to thereby leave the oxide film 12 at the both end surfaces of the substrate 11; dosing oxygen ions I into the substrate 11 from one of the exposed both main surfaces, followed by an anneal processing to thereby form an oxide layer 14 in a region at a predetermined depth from the one main surface of the substrate 11; and removing the oxide film 12 left on the both end surfaces of the substrate 11.

According to the invention of claim 1, oxygen ions I are dosed into the exposed silicon substrate 11 in a state where the resist layer 13 is removed from the oxide film 12, and the anneal processing is conducted. Thus, there can be avoided adherence of impurities such as metal into the SOI layer 11a as an active area. Further, since cross-sectional both end surfaces of the silicon substrate 11 are coated by the oxide film 12 upon ion dosing, dust occurrence from the end surfaces of the SOI layer 11a as the active area can be avoided during the subsequent device manufacturing process so that contamination due to particles onto the surface of the device is avoided.

The invention of claim 2 as shown in FIGS. 4 and 5 is a manufacturing method of a SOI substrate of claim 1, wherein the silicon substrate 11 includes a marking character area 16 for carrying marking characters for identifying the substrate 11 at an end periphery of the one of the both main surfaces of the substrate 11, and wherein the resist layer 13 covers the marking character area 16, when the resist layer 13 is formed on the oxide film 12 at the both end surfaces of the substrate 11.

According to the invention of claim 2, since the resist layer 13 covers the marking character area 16, the marking character area 16 is not exposed during the oxide film removing process. Thus, the buried silicon oxide layer 14 is not formed under the marking character area 16, thereby enabling avoidance of dust occurrence due to marking characters.

The invention according to claim 4 as shown in FIG. 6 is a manufacturing method of a SOI substrate comprising the steps of: forming an oxide film 12 at cross-sectional both main surfaces and cross-sectional both end surfaces of a silicon substrate 11; removing the oxide film 12 at one of the both main surfaces of the silicon substrate 11 to thereby expose the one main surface of the substrate 11; dosing oxygen ions I into the substrate 11 from the exposed one main surface, followed by an anneal processing to thereby form an oxide layer 14 in a region at a predetermined depth from the one main surface of the substrate 11; and removing the oxide film 12 left on the other main surface and the both end surfaces of the substrate 11.

The invention of claim 5 is a manufacturing method of a SOI substrate of claim 4, wherein removal of the oxide film 12 on the one main surface of the silicon substrate 11 is conducted by contacting only the one main surface of the silicon substrate 11 with a hydrofluoric acid aqueous solution 21 while rotating the silicon substrate 11.

According to the invention of claim 4 or 5, the process to form the resist layer in the invention according to claim 1 is not required, so that ion dosing is conducted after more readily coating the cross-sectional end surfaces of the substrate.

The invention of claim 6 is a SOI substrate free of a buried silicon oxide layer 14 just under marking characters 16a attached to the substrate surface for substrate identification.

According to the invention of claim 6, the marking characters 16a and the buried silicon oxide layer 14 never overlap with each other, thereby avoiding dust occurrence due to marking characters.

The invention of claim 7 is a semiconductor device adopting a SOI substrate free of a buried silicon oxide layer 14 just under marking characters 16a attached to the substrate surface for substrate identification.

The invention of claim 8 is a semiconductor device adopting a SOI substrate manufactured by a method of claim 1 or 3.

The invention of claim 9 is a semiconductor device adopting a SOI substrate manufactured by a method of claim 4 or 5.

According to the invention of anyone of claims 7 through 9, the semiconductor device adopts a SOI substrate having extremely lesser adherence such as of particles and impurities onto a SOI layer as an active area, leading to extremely lesser defects such as of patterning and in various deposition films.

BRIEF DESCRIPTION OF THE DRAWINGS

FIG. 6 is a partial cross-sectional view of a substrate for explaining a manufacturing process of a SOI substrate according to a third embodiment of the present invention;

BEST MODE FOR CARRYING OUT OF THE INVENTION

Figure 1:
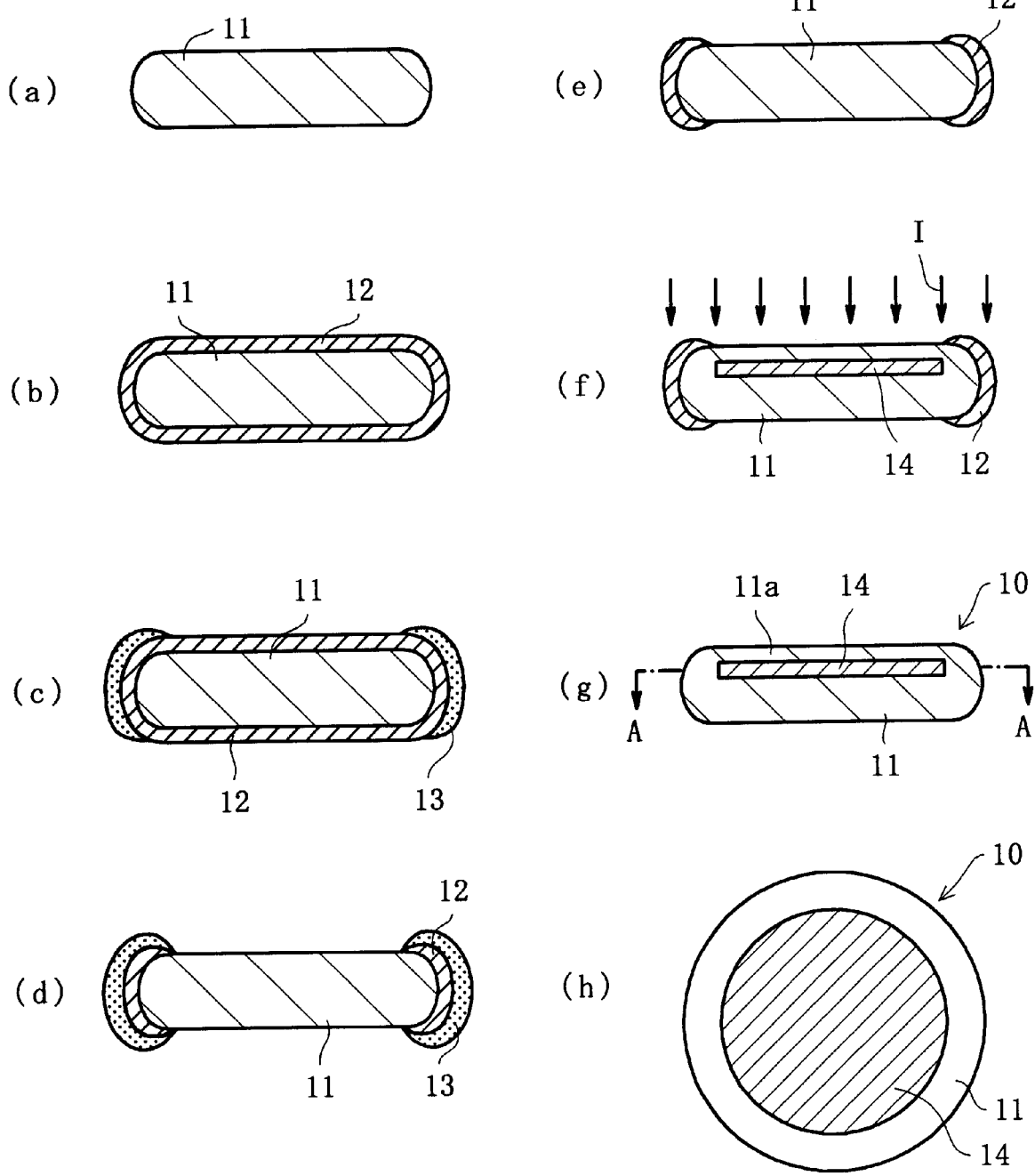
FIG. 1 is a cross-sectional view of a substrate for explaining a manufacturing process of a SOI substrate according to a first embodiment of the present invention.
Figure 2:
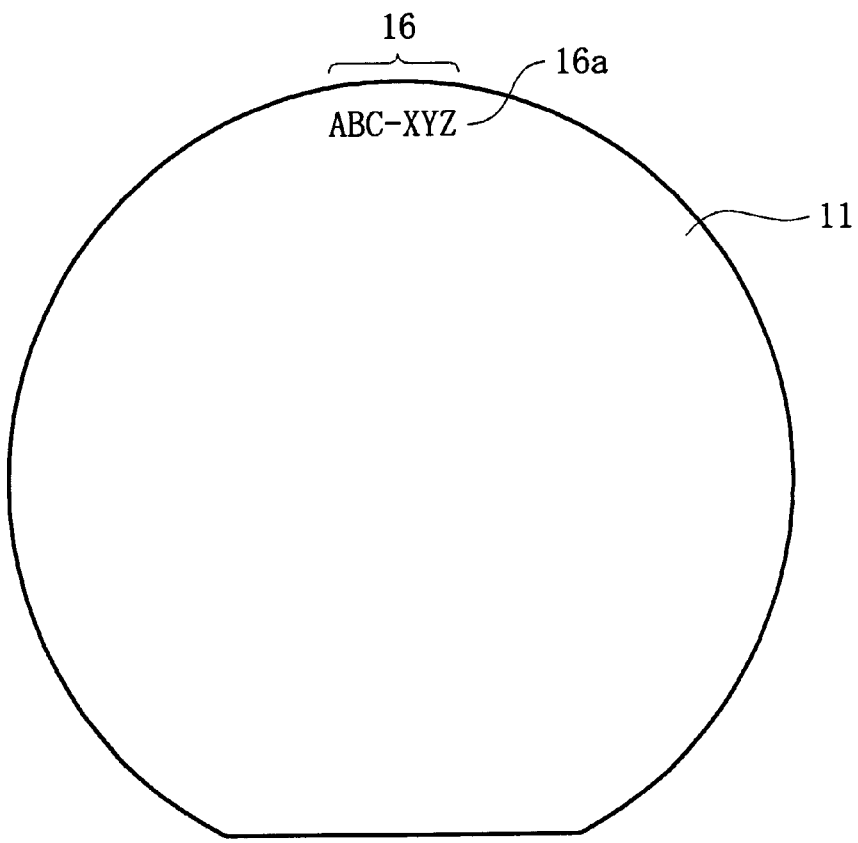
FIG. 2 is a plan view of a silicon substrate having a marking character area.

There will be firstly described a first embodiment of the present invention, based on FIG. 1. There is firstly prepared a substrate 11 (FIG. 1(a)), and an oxide film 12 is formed by a thermal oxidation method or chemical vapor deposition (CVD) method onto the whole surface, i.e., cross-sectional both main surfaces and both end surfaces (FIG. 1(b)). Next, a resist is coated onto the oxide film 12 only at both end surfaces of the substrate 11, to thereby form a resist layer 13 on the oxide film 12 (FIG. 1(c)). Then, the oxide film 12 is removed at portions not coated with the resist layer 13, to thereby expose both main surfaces of the substrate 11 (FIG. 1(d)). As means for removing the oxide film 12, there is preferably adopted a method to immerse the substrate 11 into a hydrofluoric acid aqueous solution. Next, the resist layer 13 is removed to thereby leave the oxide film 12 only at both end surfaces of the substrate 11 (FIG. 1(e)). Then, oxygen ions I are dosed into the substrate 11 from one of the exposed main surfaces of the substrate 11, followed by an anneal processing to thereby form a buried silicon oxide layer 14 in a region at a predetermined depth from the one main surface, so as to form a SOI layer 11a as an active area on the oxide layer 14 (FIG. 1(f)). Preferably, the dosage of oxygen ion is in a range from $0.4 \times 10^{18}/cm^2$ to $1.8 \times 10^{18}/cm^2$, and the anneal processing is conducted in an atmosphere of a mixed gas of argon and oxygen at a temperature of 1,300° C. to 1,390°C. for 4 to 8 hours. Finally, the oxide film 12 left at the both end surfaces of the substrate 11 are removed by immersing the oxide film 12 into a hydrofluoric acid aqueous solution, to thereby obtain a desired SOI substrate 10 (FIG. 1(g) and FIG. 1(h)). Note, FIG. 1(h) shows an A—A cross-sectional view of FIG. 1(g).

As another method to form the resist layer 13 at the cross-sectional both end surfaces of the substrate 11 alternatively to the aforementioned method to coat a resist only at the both end surfaces of the substrate, it is possible to coat a resist to thereby form a resist layer on the whole surface of a substrate (not shown), i.e., on both main surfaces and both end surfaces, then to cover the surface of the resist layer by a pattern mask, and thereafter to conduct exposure and development, to thereby leave the resist layer on the oxide film only at the both end surfaces of the substrate.

Further, as another method to leave the oxide film 12 only at the both end surfaces of the substrate 11 as shown in FIG. 1(e), it is possible to adopt a SOG coating (spin on glass coating) technique, in which a chemical solution comprising an organic solvent dissolved with silicon oxide ($SiO_x$) is coated only onto both end surfaces of a silicon substrate, followed by evaporation of the organic solvent by a heat treatment and followed by baking of the silicon oxide to thereby form an oxide film.

Figure 4:
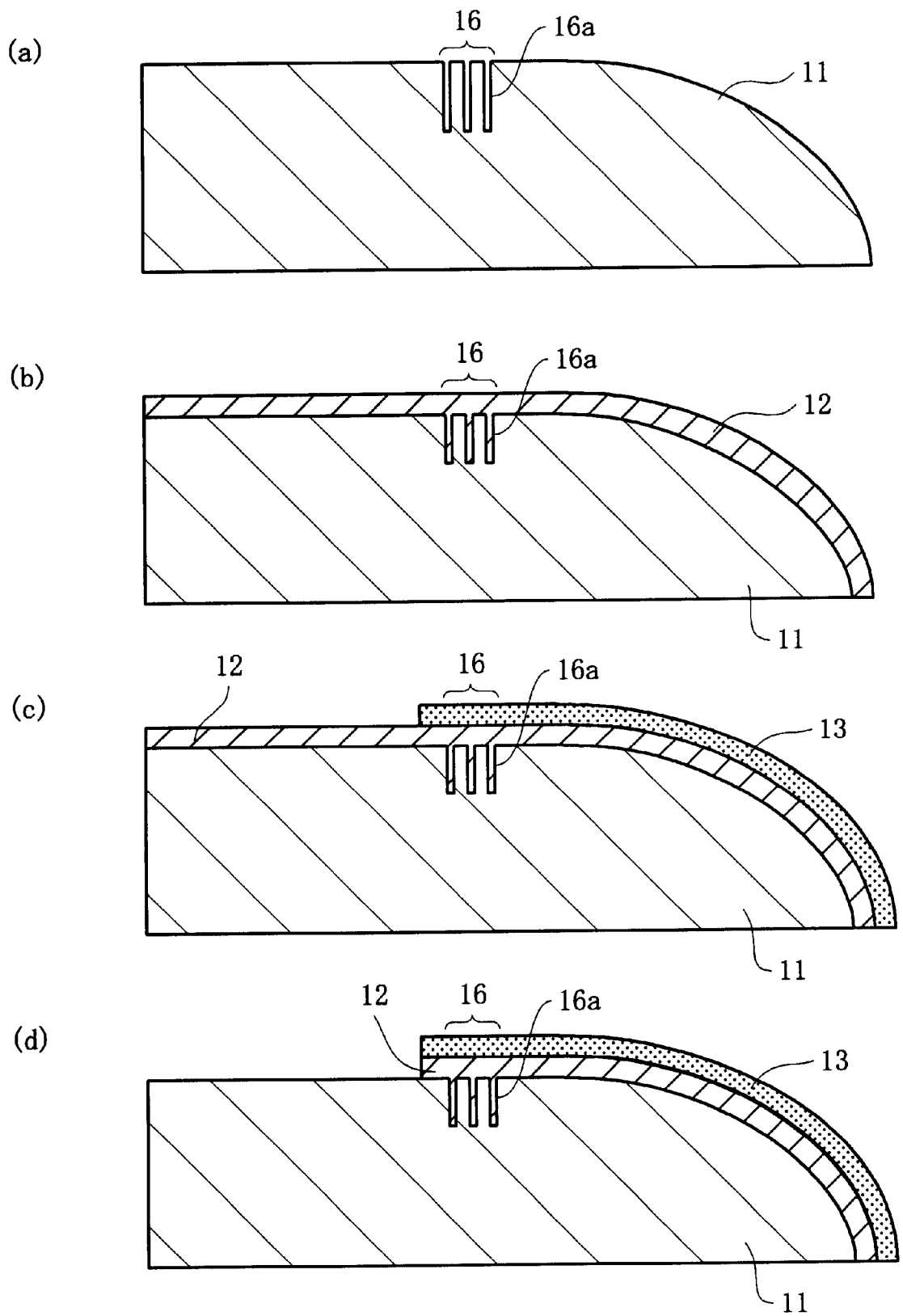
FIG. 4 is a partial cross-sectional view of a substrate for explaining a manufacturing process of a SOI substrate according to the second embodiment of the present invention.
Figure 5:
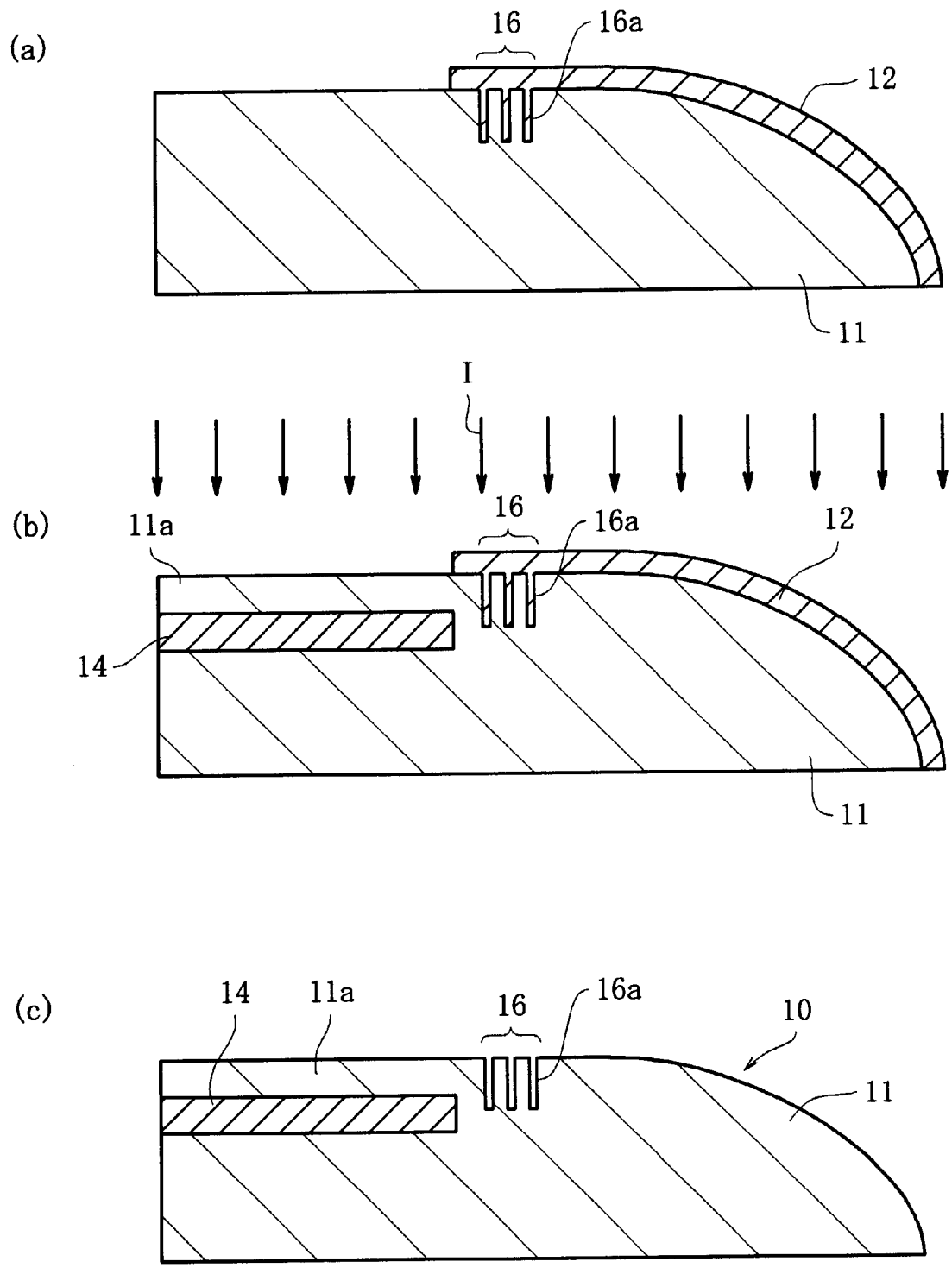
FIG. 5 is another partial cross-sectional view of a substrate for explaining the manufacturing process of a SOI substrate according to the second embodiment of the present invention.

FIG. 4 and FIG. 5 show a second embodiment of the present invention.

In this embodiment, there will be described a situation where marking characters are attached to a silicon substrate before manufacturing a SOI substrate. Like reference numerals as used in FIG. 1 are used to denote identical elements in FIG. 4 and FIG. 5.

Figure 3:
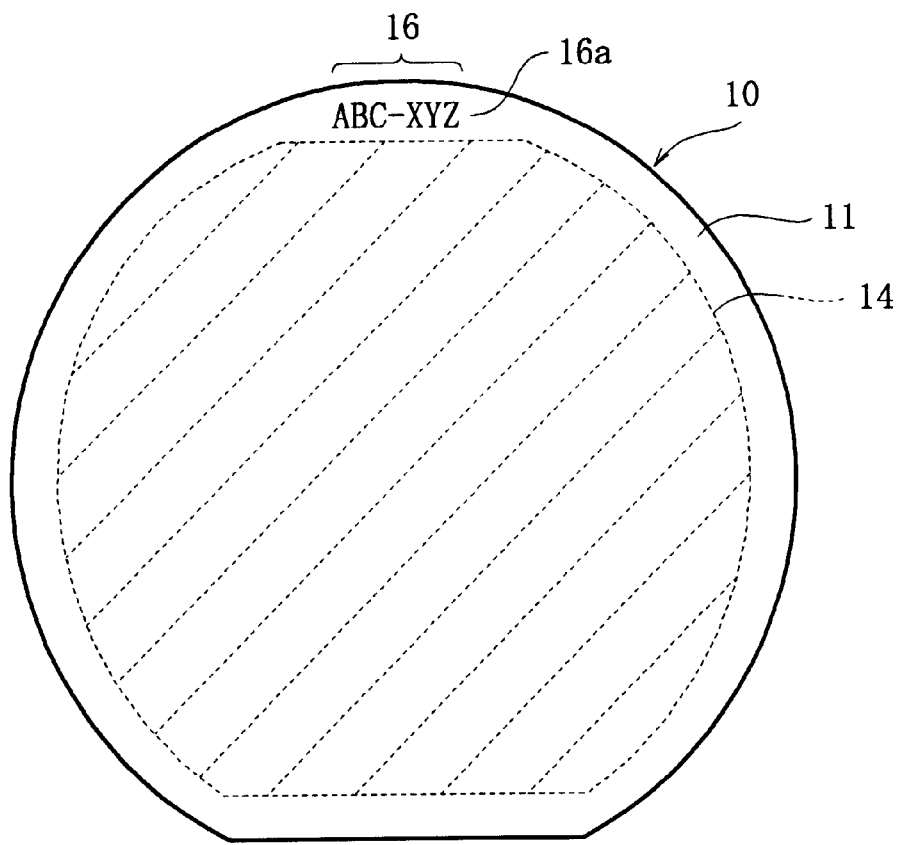
FIG. 3 is a plan view of a SOI substrate provided with marking characters, manufactured by a method according to a second embodiment of the present invention.

There is firstly prepared a silicon substrate 11 having a marking character area 16 (FIG. 4(a)), and an oxide film 12 is formed on the whole surface of the silicon substrate 11, i.e., cross-sectional both main surfaces and both end surfaces thereof (FIG. 4(b)). Then, a resist is coated onto the oxide film 12 at both end surfaces of the silicon substrate 11, to thereby form a resist layer 13 (FIG. 4(c)). When the resist is formed on the oxide film 12 at both end surfaces, the resist layer 13 also coats the marking character area 16 carrying marking characters 16a formed by laser irradiation. That part of the oxide film which is not coated with the resist layer 13 is removed, to thereby expose both main surfaces of the silicon substrate 11 (FIG. 4(d)). Next, the resist layer 13 is removed to thereby leave the oxide film 12 on the both end surfaces and the marking character area 16 of the silicon substrate 11 (FIG. 5(a)). Then, oxygen ions I are dosed into the substrate 11 from one of the exposed main surfaces of the substrate 11 followed by an anneal processing to thereby form a buried silicon oxide layer 14 in a region at a predetermined depth from the one main surface, so as to form a SOI layer 11a as an active area on the oxide layer 14 (FIG. 5(b)). Finally, the oxide film 12 left at the both end surfaces and the marking character area 16 of the substrate 11 is removed by immersing the oxide film 12 into a hydrofluoric acid aqueous solution, to thereby obtain a desired SOI substrate 10 (FIG. 5(c) and FIG. 3). FIG. 3 is a plan view of the SOI substrate manufactured by this embodiment. In this way, there is obtained the SOI substrate which is free of the oxide layer 14 just under the marking characters 16a attached to the substrate surface for substrate identification.

Although not shown, when marking characters are to be attached to a main surface of a SOI substrate after the SOI substrate is manufactured, that area intended for marking characters is to be coated by a resist layer before marking. Concretely, there is firstly prepared a silicon substrate, and an oxide film is formed on the whole surface, i.e., cross-sectional both main surfaces and both end surfaces of this silicon substrate. Next, a resist is coated onto the oxide film at the both end surfaces of the silicon substrate, to thereby form resist layer. That area intended for marking characters is also coated by the resist layer upon forming the oxide film at the both end surfaces of the substrate. That oxide film not coated by the resist layer is removed, to thereby expose the both main surfaces of the substrate. Next, the resist layer is removed, to thereby leave the oxide film at both end surfaces and the marking character area(s) of the silicon substrate. Thereafter, oxygen ions are dosed into the substrate from one of the exposed main surfaces of the substrate, followed by an anneal processing to thereby form a buried silicon oxide layer in a region at a predetermined depth from the one main surface, so as to form a SOI layer as an active area on the oxide layer. Finally, the oxide film left at the both end surfaces and the area intended for marking characters of the substrate is removed by immersing the oxide film into a hydrofluoric acid aqueous solution, to thereby obtain a desired SOI substrate.

FIG. 6 shows a third embodiment of the present invention. Like reference numerals as used in FIG. 1 are used to denote identical elements in FIG. 6. In this embodiment, there is prepared a silicon substrate 11 (FIG. 6(a)) similarly to the situation of FIG. 1(a), and an oxide film 12 is formed on the whole surface, i.e., cross-sectional both main surfaces and both end surfaces of the silicon substrate 11 (FIG. 6(b)) similarly to the situation of FIG. 1(b). Next, the oxide film 12 at one of main surfaces is removed, to thereby expose one main surface of the silicon substrate 11 (FIG. 6(c)).

To this end, the silicon substrate 11 formed with the oxide film 12 at the both main surfaces and both end surfaces is arranged above a reservoir 22 filled with a hydrofluoric acid aqueous solution 21 as shown in FIG. 7(a). The silicon substrate 11 is then lowered while this substrate 11 is rotated at a low speed by a device (not shown) for rotating, raising and lowering the substrate 11, such that only one main surface corresponding to the lower surface of the substrate 11 is contacted with the hydrofluoric acid aqueous solution 21. At this time, a carrier gas 23 such as argon is flown from the above of the reservoir 22 onto the upper surface of the carrier gas 23 and onto the hydrofluoric acid aqueous solution 21, as shown by arrows. When the lower one of the main surfaces of the substrate 11 is contacted with the hydrofluoric acid aqueous solution 21, the solution 21 uniformly contacts with the oxide film 12 on the corresponding main surface by virtue of surface tension of the solution 21 as shown in FIG. 7(a), to thereby dissolvingly remove this oxide film 12. The carrier gas 23 is flown as shown by the arrows in the drawing, to thereby avoid corrosion of the oxide film 12 at cross-sectional end surfaces of the substrate due to the vapor of the hydrofluoric acid aqueous solution.

Thereafter, the substrate 11 is kept contacted with the solution 21 for a predetermined period of time, and then the substrate 11 is slowly lifted from the solution 21 while rotating the substrate 11 at a low speed as shown in FIG. 7(b). This provides the substrate 11 one of the main surfaces of which is exposed (FIG. 6(c)).

Then, similarly to the situation shown in FIG. 1(f), oxygen ions I are dosed into the substrate 11 from the exposed main surface of the substrate 11 followed by an anneal processing to thereby form a buried silicon oxide layer 14 in a region at a predetermined depth from the exposed main surface (FIG. 6(d)). Finally, the oxide film 12 left at the both end surfaces and at the other main surface of the substrate 11 is duly removed, to thereby obtain a desired SOI substrate 10 (FIG. 6(e)).

Figure 7:
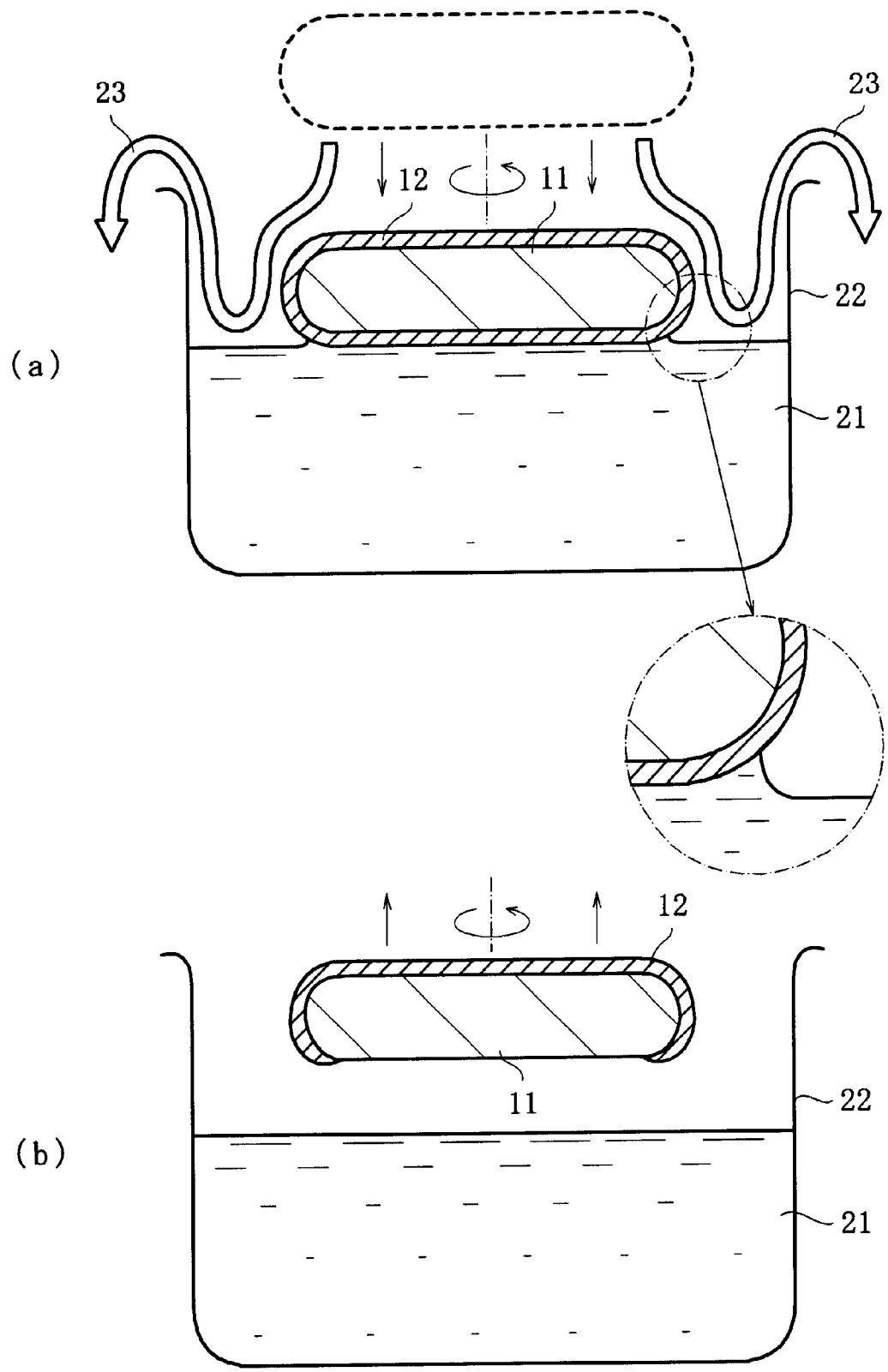
FIG. 7 is a view showing a process to remove an oxide film on one of main surfaces of a silicon substrate by a hydrofluoric acid aqueous solution in the method according to the third embodiment of the present invention.
Figure 8:
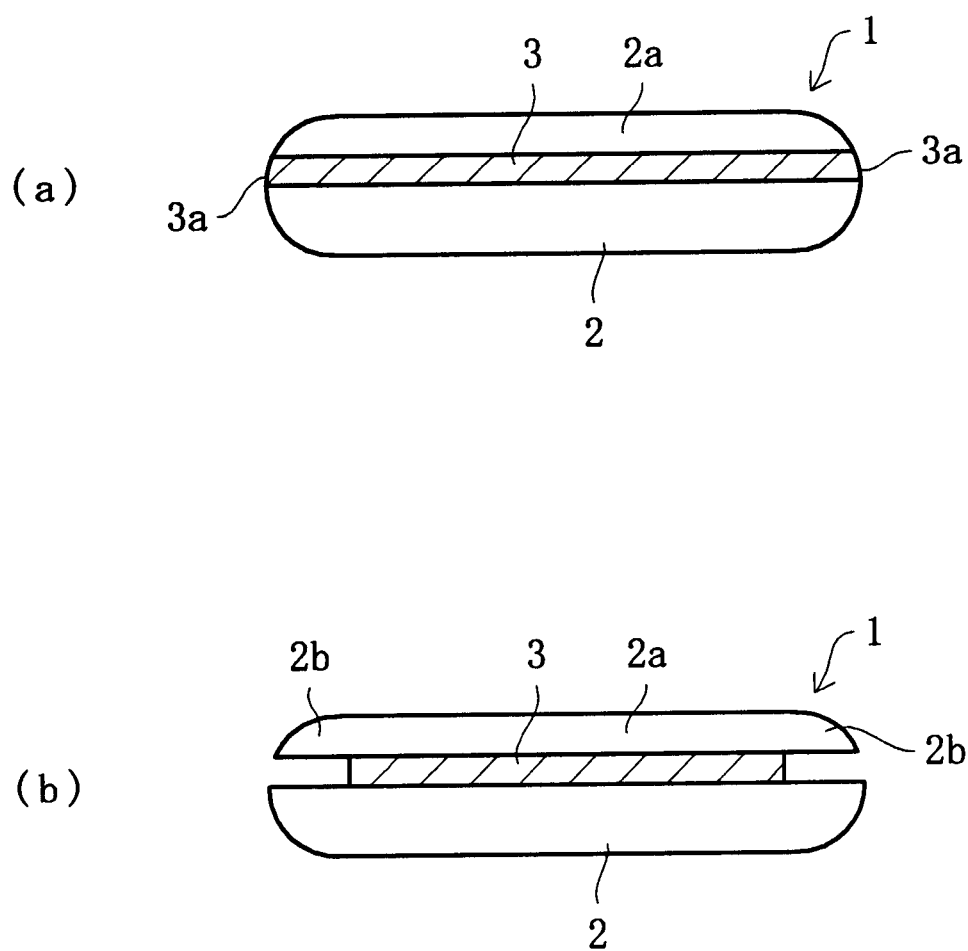
FIG. 8 is a cross-sectional view showing a conventional SOI substrate.
Figure 9:
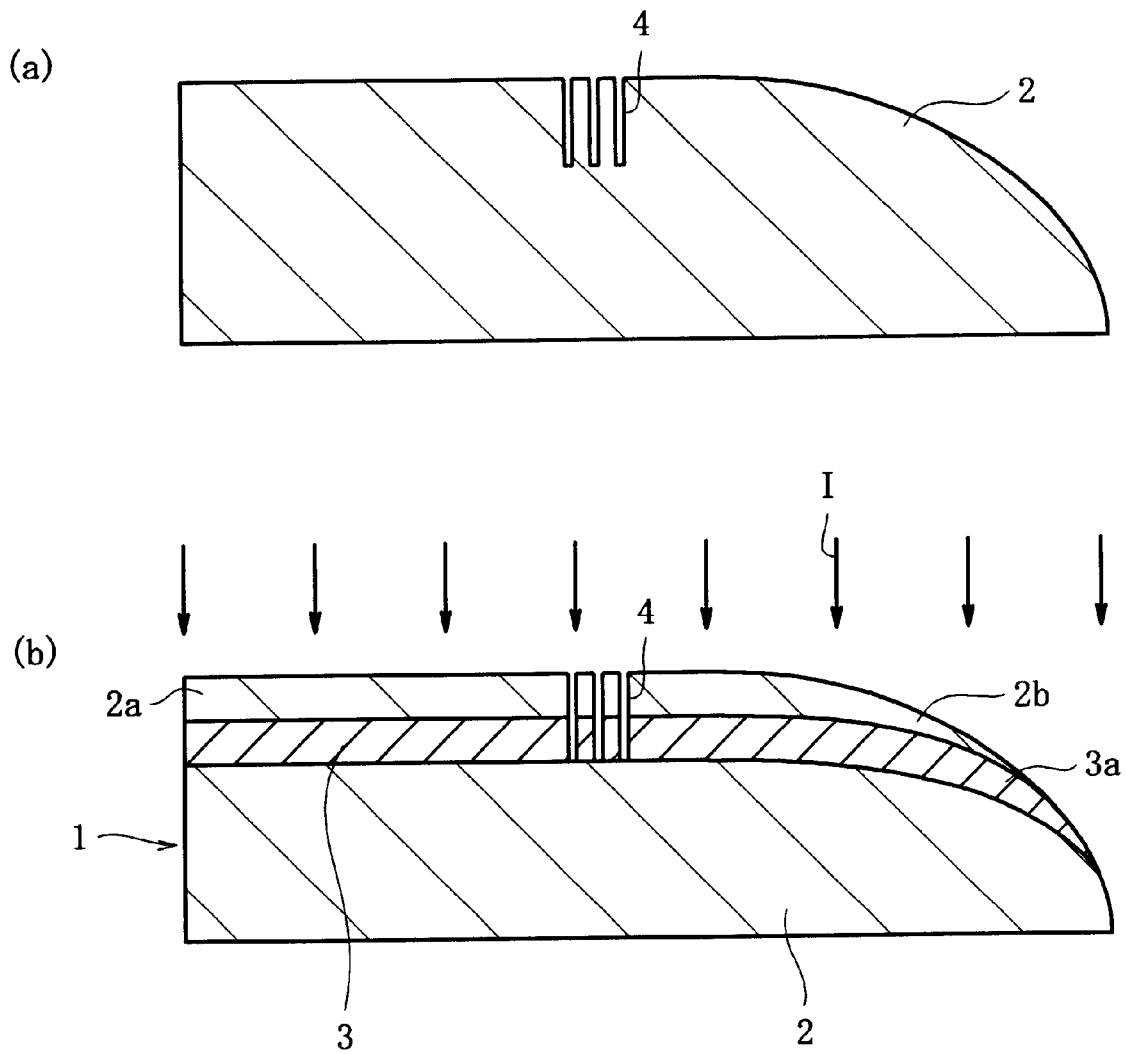
FIG. 9 is a partial cross-sectional view of a substrate for explaining a manufacturing process of a conventional SOI substrate having a marking character area.

In addition to the method shown in FIG. 7, as another method to partially remove an oxide film at one of main surfaces of a substrate wholly coated with the oxide film, it is possible to adopt a method to use a chemical polishing agent according to a chemical mechanical polishing (CMP) method to thereby mechanically shave an oxide film only at one of main surfaces of a substrate, and then to wash away the chemical polishing agent.

Figure 10:
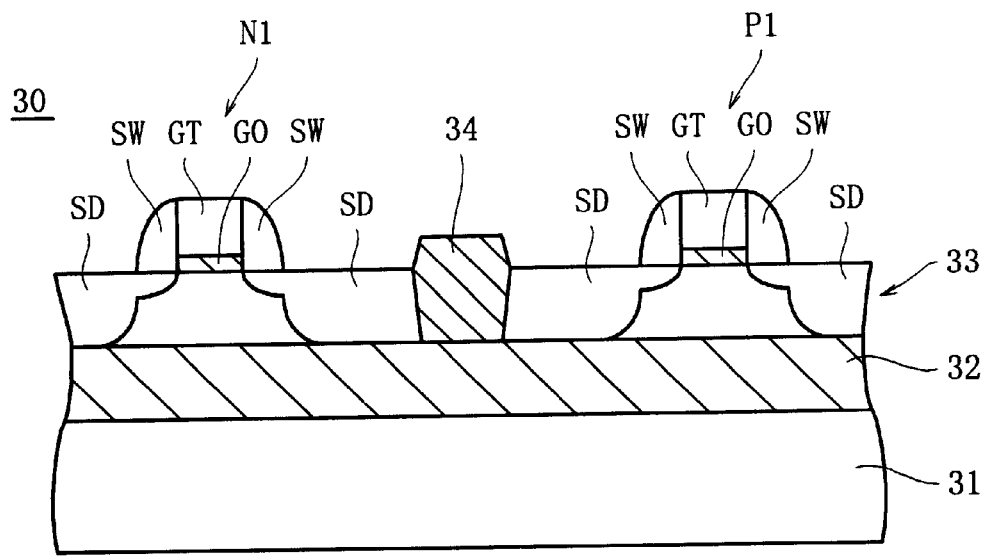
FIG. 10 is a cross-sectional view of a semiconductor device in which MOS transistors are electrically isolated by trench isolation according to a fourth embodiment of the present invention.

FIGS. 10 through 19 show a fourth embodiment of the present invention. In this embodiment, there is formed a semiconductor device making use of the SOI substrate fabricated in the second embodiment. Semiconductor devices (hereinafter called "SOI device") each having a SOI structure to be formed on a SOI substrate in which a buried silicon oxide layer and a SOI layer are provided on a silicon substrate, have reduced parasitic capacitance, have features of a high-speed operation and a reduced power consumption, and are used such as in portable devices. As an example of such a SOI device, FIG. 10 shows a partial sectional constitution of a SOI device 30 in which MOS transistors are electrically isolated by trench isolation.

In the SOI substrate provided by disposing a buried silicon oxide layer 32 and a SOI layer 33 on a silicon substrate 31 as shown in FIG. 10, there are provided an N-channel type MOS transistor (NMOS transistor) N1 and a P-channel type MOS transistor (PMOS transistor) P1 on the SOI layer 33, and these transistor are electrically isolated fully by an isolating oxide film 34. Note, the isolating oxide film 34 is provided so as to surround the NMOS transistor N1 and PMOS transistor P1.

Each of the NMOS transistor N1 and PMOS transistor P1 is constituted of a source/drain region SD formed in the SOI layer 33, a channel forming region CH, a gate oxide film GO formed on the channel forming region CH, a gate electrode GT formed on the gate oxide film GO, and a sidewall SW surrounding the side surface of the gate electrode GT.

In this way, the NMOS transistor N1 and PMOS transistor P1 in the SOI device 30 are not only independent of each other by the isolating oxide film 34 in the SOI layer 33, but also fully independent of other semiconductor elements, for example, to thereby present a structure theoretically free of latchup for both transistors.

Thus, in manufacturing SOI devices having CMOS transistors, there is obtained such a merit that a minimum isolation width to be determined by a fine processing technology can be used to thereby downsize a chip surface area.

Figure 11:
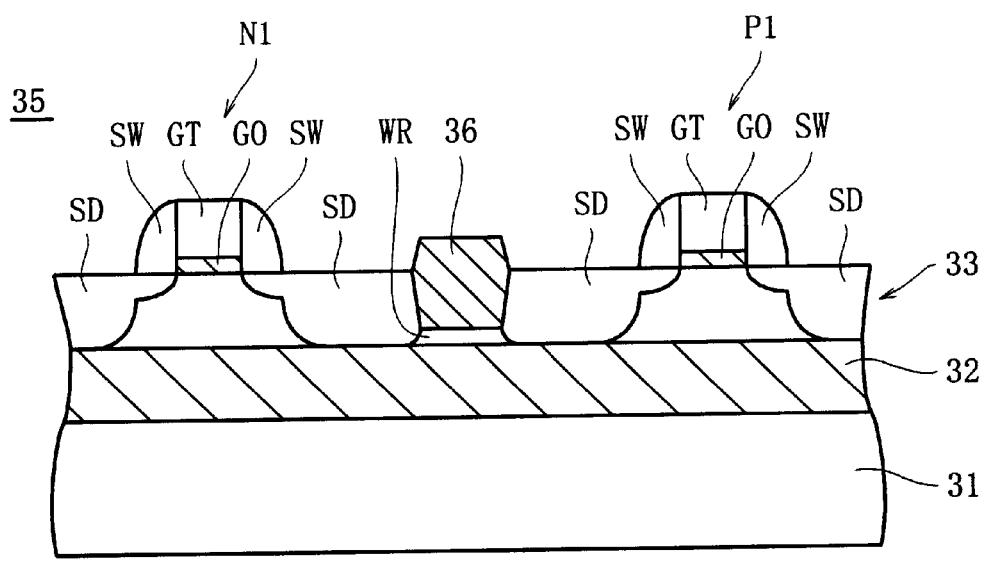
FIG. 11 is a cross-sectional view of a semiconductor device having a partial trench isolation structure (PTI structure) according to the fourth embodiment of the present invention.

Next, as another example of a SOI device, FIG. 11 shows a partial sectional constitution of a SOI device 35 having a partial trench isolation structure (PTI structure).

In FIG. 11, there are provided an NMOS transistor N1 and a PMOS transistor P1 on a SOI layer 33, and these transistors are isolated by a partial isolating oxide film 36 provided with a well region WR at its lower portion. Note, the partial isolating oxide film 36 is provided so as to surround the NMOS transistor N1 and PMOS transistor P1.

As compared with the partial isolating oxide film 36 here, an appellation "full trench isolation structure (FTI structure)" is given to a structure where a trench oxide film such as the isolating oxide film 34 in the SOI device 35 reaches the buried silicon oxide layer 32 to thereby electrically and fully isolate elements from one another, and the oxide film of such a structure is called "fully isolating oxide film".

In this way, the NMOS transistor N1 and PMOS transistor P1 are isolated from each other by the partial isolating oxide film 36. Nonetheless, carriers are allowed to move through the well region WR at the lower portion of the partial isolating oxide film 36, to thereby avoid accumulation of carriers in the channel forming region, and to thereby fix the electric potential of the channel forming region via well region WR, thereby providing such an advantage that various problems due to a substrate floating effect can be avoided.

There will be now described a manufacturing method of a SOI device 37 having a PTI structure, by exemplarily showing a semiconductor device formed with transistors having different threshold voltages, with reference to FIGS. 12 through 19.

Figure 12:
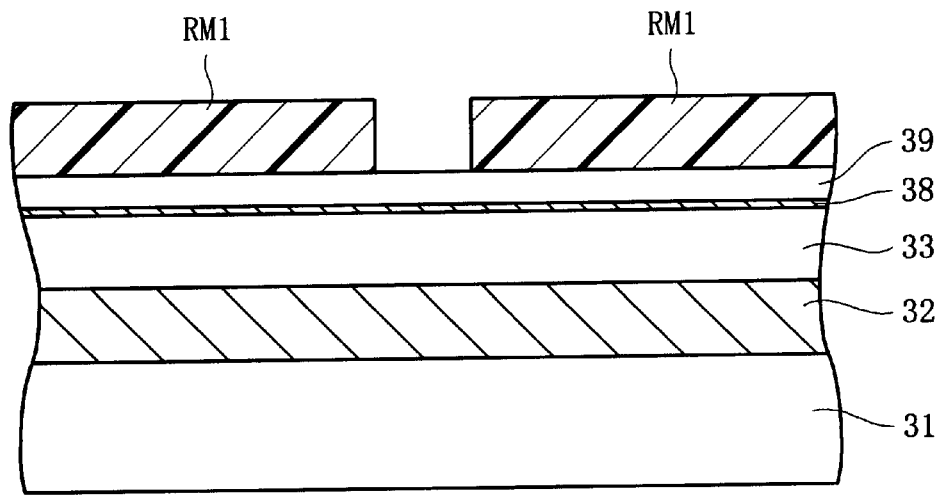
FIGS. 12 through 19 are cross-sectional views showing a substrate for explaining a manufacturing process of the semiconductor device having the PTI structure according to the fourth embodiment of the present invention.

There is firstly prepared a SOI substrate constituted of a silicon substrate 31, a buried silicon oxide layer 32 and a SOI layer 33, in which the buried silicon oxide layer 32 is formed by oxygen ion dosing. As shown in FIG. 3, this SOI substrate is one having no silicon oxide layers just under marking characters 16a attached to the substrate surface for substrate identification. Instead of the SOI substrate shown in FIG. 3, there can be adopted the SOI substrate shown in FIG. 1(h) or FIG. 6(e), in the semiconductor device of this embodiment. The film thickness of the SOI layer 33 is from 50 to 200 nm, and that of the buried silicon oxide layer 32 is from 100 to 400 nm. As shown in FIG. 12, an oxide film 38 having a thickness on the order of 10 to 30 nm (100 to 300 Angstrom) is formed on the SOI substrate by a CVD method or thermal oxidation, followed by formation of a nitride film 39 having a thickness of from 30 to 200 nm (300 to 2,000 Angstrom) on the oxide film 38. Subsequently, a resist mask RM1 is formed on the nitride film 39, by patterning. This resist mask RM1 has an opening part for forming a trench.

Figure 13:
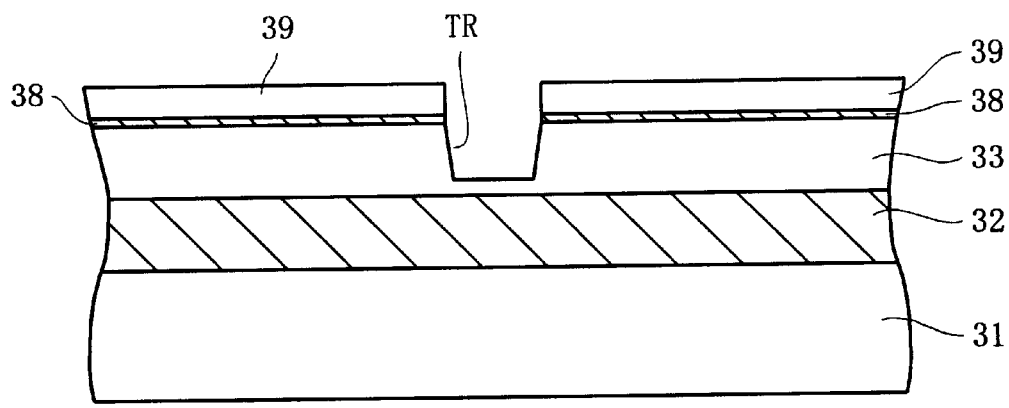

Next, the nitride film 39, oxide film 38 and SOI layer 33 are patterned by etching by using the resist mask RM1, to thereby form a partial trench TR in the SOI layer 33 as shown in FIG. 13. In this etching, without fully etching the SOI layer 33 to an extent to expose the buried silicon oxide layer 32, the etching condition is adjusted to leave the SOI layer 33 of a predetermined thickness at the bottom portion of the trench.

Since the partial trench TR is formed to extend in a substantially vertical direction with a predetermined width relative to the silicon substrate 31, it becomes possible to isolate elements from each other with keeping fineness and without deteriorating the degree of integration.

Figure 14:
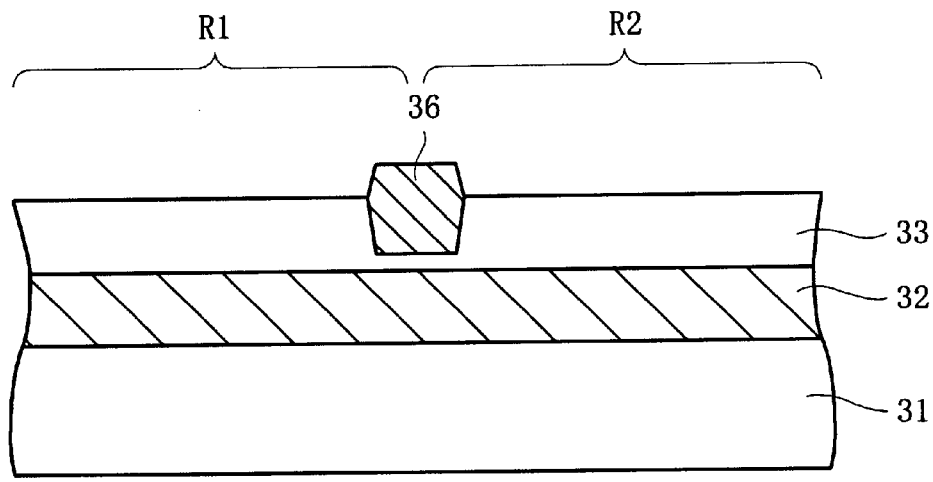

Next, an oxide film having a thickness on the order of 500 nm (5,000 Angstrom) is deposited in the process as shown in FIG. 14, and the oxide film is polished by a CMP (chemical mechanical polishing) processing up to the midway of the nitride film 39. Thereafter, the nitride film 39 and oxide film 38 are removed to thereby form the partial isolating oxide film 36. Here, the leftward region in FIG. 14 is supposed to be a first region R1 for forming a transistor of a lower threshold voltage, and the rightward region is supposed to be a second region R2 for forming a transistor having a general threshold voltage and higher reliability.

Figure 15:
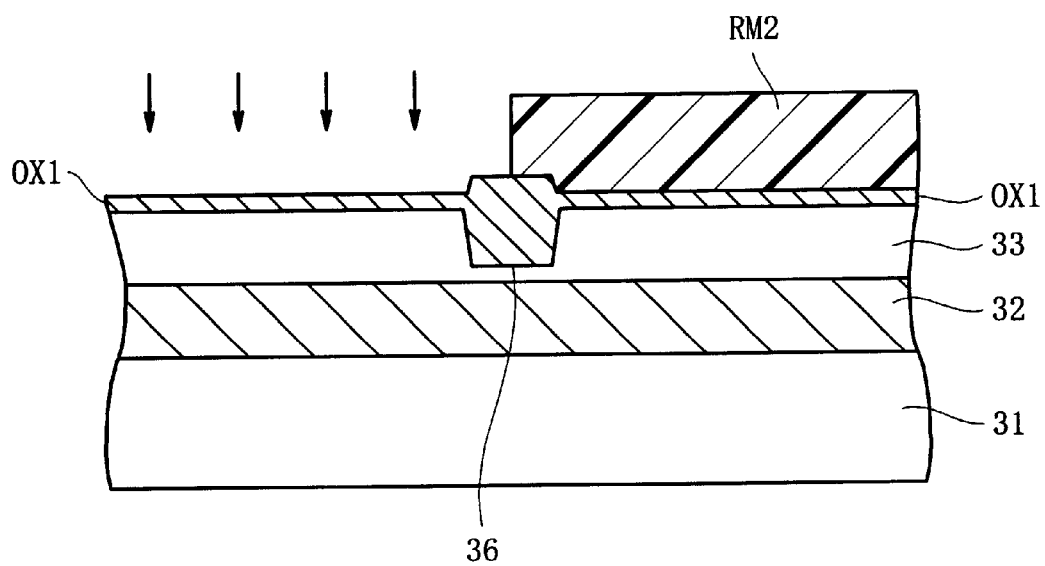

Next, in the process shown in FIG. 15, an oxide film OX1 is formed over the whole area on the SOI layer 33. This oxide film OX1 has a thickness from 1 to 4 nm (10 to 40 Angstrom). Thereafter, a resist mask RM2 is formed to cover the second region R2, and semiconductor impurities are doped into the SOI layer 33 via oxide film OX1 by ion dosing. The dosing requirement in this case is for forming a transistor having a lower threshold voltage, and if an NMOS transistor is to be formed, for example, boron (B) ion is dosed at an energy of 5 to 40 keV and in a dosage of $1\times10^{11}$ to $3\times10^{11}/cm^2$. Before this, there is conducted a process for forming a well region, by dosing boron ion at an energy of 30 to 100 keV and in a dosage of $1\times10^{12}$ to $1\times10^{14}/cm^2$.

Figure 16:
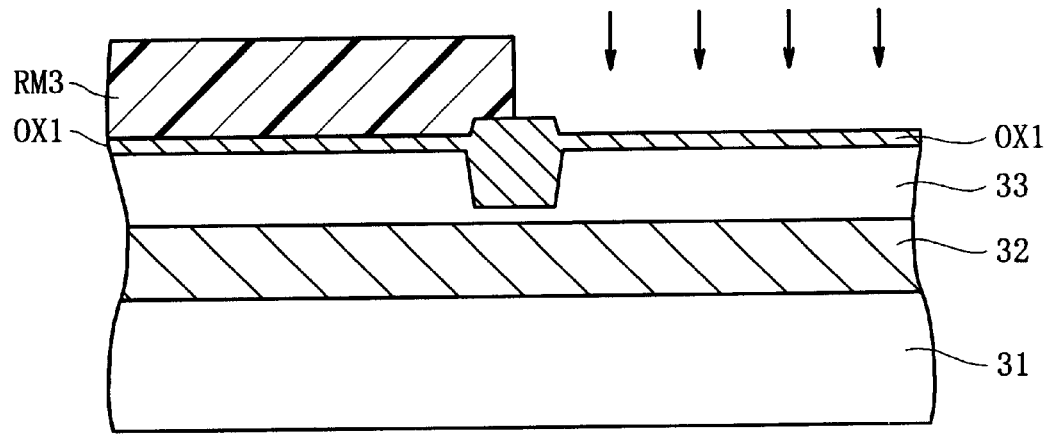

Next, after removing the resist mask RM2, a resist mask RM3 is formed to cover the first region R1 in the process shown in FIG. 16, and semiconductor impurities are doped into the SOI layer 33 of the second region R2 via oxide film OX1 by ion dosing. The dosing requirement in this case is for forming a transistor having a general threshold voltage, and if an NMOS transistor is to be formed, for example, boron (B) ion is dosed at an energy of 5 to 40 keV and in a dosage of $3\times10^{11}$ to $5\times10^{11}/cm^2$.

Figure 17:
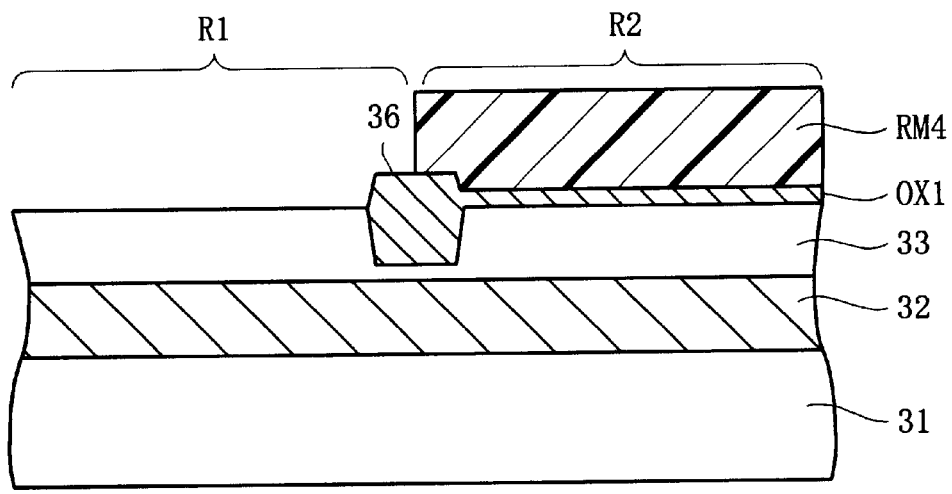

Next, after removing the resist mask RM3, a resist mask RM4 is formed to cover the second region R2 in the process shown in FIG. 17, and the oxide film OX1 in the first region R1 is removed.

Figure 18:
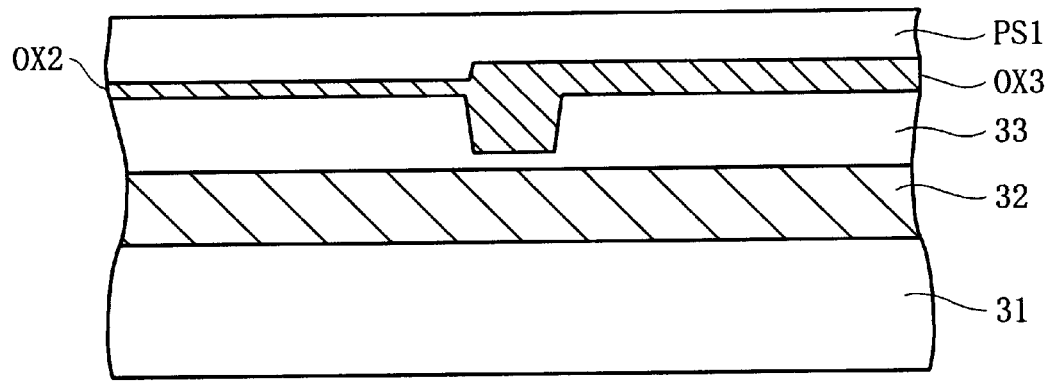

After removing the resist mask RM4, an oxide film is formed over the whole area of the SOI layer as shown in FIG. 18. At this time, an oxide film OX2 having a thickness of 2 to 4 nm (20 to 40 Angstrom) is formed in the first region R1, and the thickness of the oxide film OX1 is increased to become an oxide film OX3 in the second region R2. Thereafter, a polycrystalline silicon layer (hereinafter called "polysilicon layer") PS1 intended for a gate electrode is formed over the whole area.

Figure 19:
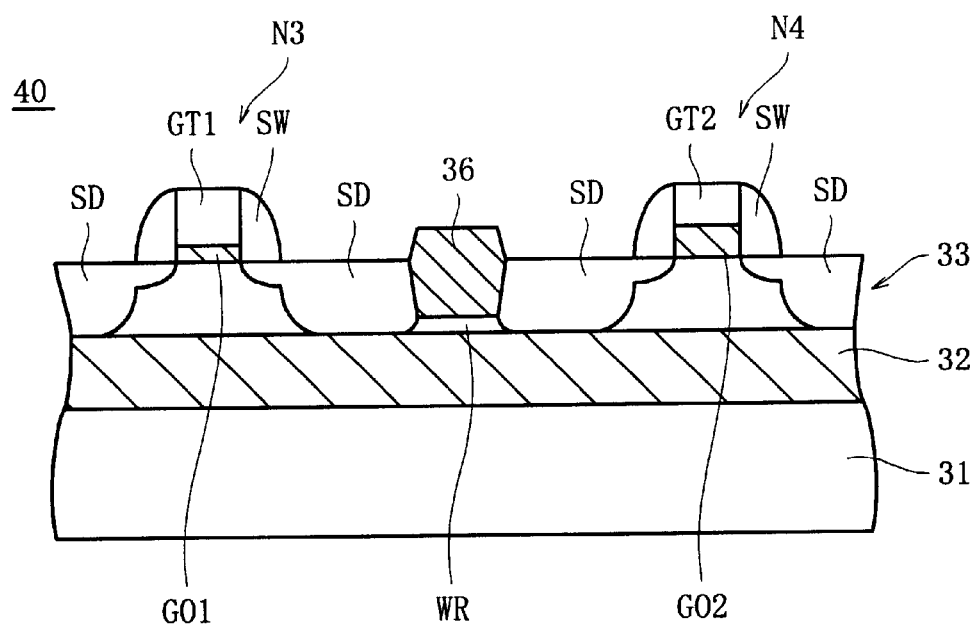

Next, in the process shown in FIG. 19, the polycrystalline silicon layer PS1, oxide films OX2 and OX3 are patterned to form gate electrodes GT1 and GT2 and gate oxide films GO1 and GO2. Further, by forming respective sidewall oxide films SW and source/drain layers SD, NMOS transistors N3 and N4 are formed. Note, the lower portion of the partial isolating oxide film 36 is formed to be the well region WR.

Although interlayer insulating films are formed on the NMOS transistors N3, N4 and there is formed a plurality of contact holes which penetrates the interlayer insulating films to thereby reach the source/drain layers SD, these are omitted from the drawing.

The thus obtained semiconductor device adopts a SOI substrate having a SOI layer substantially free of adhered particles and impurities, leading to extremely lesser defects such as of patterning and in various deposition films.

In this embodiment, there has been described the semiconductor device in which those transistors having different threshold values are isolated by the PTI structure. However, those transistors formed to have the same threshold values may be isolated by an FTI structure. Further, without limited to a MOS transistor, there may be adopted a semiconductor device formed with any type of transistor such as bipolar transistor.

There will be described hereinafter an embodiment example of the present invention together with comparative examples.

EMBODIMENT EXAMPLE 1

There was manufactured a SOI substrate 10 based on the method shown in FIG. 1. Namely, there was prepared an 8-inch substrate 11 having a thickness of 725 µm, and an oxide film 12 was formed by thermal oxidation on cross-sectional both main surfaces and cross-sectional both end surfaces of this substrate 11. Next, a resist was coated onto the oxide film 12 only at the both end surfaces of the substrate 11 to thereby form a resist layer 13 on the oxide film 12, followed by immersion of the substrate into a buffered hydrofluoric acid solution (BHF solution) so as to remove that portion of oxide film 12 which is not covered by the resist layer 13, thereby exposing the both main surfaces of the substrate 11. Next, the resist layer 13 is removed by oxidation by oxygen plasma, to thereby leave the oxide film 12 at both end surfaces of the substrate 11. Under this state, oxygen ions I were dosed into the substrate 11 down to a region at a depth of about 0.4 µm from one of the exposed both main surfaces of the substrate 11, under the following conditions:

Acceleration Voltage: 200 kev;

Beam Current: 40 to 50 mA;

Dosage: $1.8\times10^{18}/cm^2$; and

Substrate Heating Temperature: 600° C.

After dosing oxygen ions I, the substrate 11 was anneal processed in an atmosphere of a mixed gas of argon (99%) and oxygen (1%) at a temperature of 1,350° C. for 5 hours, to thereby form an oxide layer 14. Finally, the oxide film 12 left at the both end surfaces of the substrate 11 was removed by immersing the substrate 11 into a hydrofluoric acid aqueous solution, to thereby obtain a desired SOI substrate 10.

Comparative Example 1

By adopting a silicon substrate identical with that of the embodiment example 1, and without forming an oxide film and a resist layer, oxygen ions were dosed into the substrate under the same condition as the embodiment example 1, to thereby obtain a SOI substrate.

Comparative Example 2

By adopting a silicon substrate identical with that of the embodiment example 1, and by forming a resist layer only at cross-sectional both end surfaces of this substrate, oxygen ions were dosed into the substrate under the same condition as the embodiment example 1. After dosing oxygen ions, the resist layer was removed to obtain a SOI substrate.

Comparative Test

SOI substrates according to the embodiment example 1, comparative example 1 and comparative example 2 were immersed into a hydrofluoric acid aqueous solution, and then washed by ultrapure water. After drying, there were measured those particles of 0.25 µm or more adhered on the substrate surfaces of these SOI substrates, by a particle counter (SS6420 by Tencor Co., Ltd.).

Further, there were measured concentrations of metal impurities at surfaces of these SOI substrates. Each concentration of metal impurities was measured, by dropping a mixed acid of hydrofluoric acid and nitric acid onto a central part of a pertinent one of dried SOI substrates, by spreading droplets of the mixed acid over the whole surface of the substrate, and by collecting the droplets for atomic absorption analysis.

The numbers of particles in the whole surface of the SOI substrates were 20 in the embodiment example 1, 70 in the comparative example 1, and 45 in the comparative example 2. Further, the concentrations of metal impurities in the SOI substrate surface were below a detection limit (below $1\times10^9$ atoms/cm$^2$) concerning Al, Fe, Ni Cu and Zn in the embodiment example 1 and comparative example 1. Contrary, in the comparative example 2, concentrations of Ni and Cu were below a detection limit, those of Al, Fe and Zn were $1\times10^{11}$ atoms/cm$^2$, $2\times10^{10}$ atoms/cm$^2$, and $5\times10^9$ atoms/cm$^2$, respectively.

Industrial Applicability

The manufacturing method of a SOI substrate buried with an insulating layer within a silicon substrate avoids adherence of particles caused by silicon fragments and impurities such as metal within a resist, to thereby improve product yield and avoid dust occurrence caused by marking characters. Further, the SOI substrate of the present invention attached with marking characters never causes dust occurrence due to marking characters.

What is claimed is:

1. A method for manufacturing an SOI substrate b a SIMOX technique, said SOI substrate comprising the steps of:
    forming an oxide film (12) at cross-sectional both main surfaces and both end surfaces of a silicon substrate (11);
    forming a resist layer (13) on said oxide film (12) at cross-sectional both end surfaces of said substrate (11);
    removing said oxide film (12) at those portions which are left from the covering of said resist layer (13), to thereby expose said both main surfaces of said silicon substrate (11);
    removing said resist layer (13) to thereby leave said oxide film (12) at said both end surfaces of said substrate (11);
    dosing oxygen ions (I) into said substrate (11) from one of said exposed both main surfaces, followed by an anneal processing to thereby form an oxide layer (14) in a region at a predetermined depth from said one main surface of said substrate (11); and
    removing said oxide film (12) left on said both end surfaces of said substrate (11) to thereby obtain an SOI substrate having a buried silicon oxide layer (14) in a region at a predetermined depth from one main surface of a silicon substrate (11) except just under both end surfaces of said substrate (11).

2. A method for manufacturing an SOI substrate of claim 1,
    wherein said silicon substrate (11) includes a marking character area (16) for carrying marking characters for identifying said substrate (11) at an end periphery of said one of said both main surfaces of said substrate (11), and
    wherein said resist layer (13) covers said marking character area (16), when said resist layer (13) is formed on said oxide film (12) at said both end surfaces of said substrate (11).

3. A method for manufacturing an SOI substrate of claim 2, wherein removal of said oxide film (12) is conducted by immersing said substrate (11) into a hydrofluoric acid aqueous solution.

4. A semiconductor device adopting an SOI substrate manufactured by a method of claim 3.

5. A manufacturing method of a SOI substrate of claim 1, wherein removal of said oxide film (12) is conducted by immersing said substrate (11) into a hydrofluoric acid aqueous solution.

6. A semiconductor device adopting an SOI substrate manufactured by a method of claim 5.

7. A semiconductor device adopting an SOI substrate manufactured by a method of claim 1.

8. A method for manufacturing an SOI substrate by a SIMOX technique, said SOI substrate comprising the steps of:
    forming an oxide film (12) at cross-sectional both main surfaces and cross-sectional both end surfaces of a silicon substrate (11);
    removing said oxide film (12) at one of said both main surfaces of said silicon substrate (11) to thereby expose said one main surface of said substrate (11);
    dosing oxygen ions (I) into said substrate (11) from said exposed one main surface, followed by an anneal processing to thereby form an oxide layer (14) in a region at a predetermined depth from said one main surface of said substrate (11); and
    removing said oxide film (12) left on the other main surface and said both end surfaces of said substrate (11) to obtain an SOI substrate having a buried silicon oxide layer (14) in a region at a predetermined depth from one main surface of a silicon substrate (11) except just under both end surfaces of said substrate (11).

9. A method for manufacturing an SOI substrate of claim 8,
    wherein removal of said oxide film (12) on said one main surface of said silicon substrate (11) is conducted by contacting only said one main surface of said silicon substrate (11) with a hydrofluoric acid aqueous solution (21) while rotating said silicon substrate (11).

10. A semiconductor device adopting an SOI substrate manufactured by a method of claim 9.

11. A semiconductor device adopting an SOI substrate manufactured by a method of claim 8.

12. An SOI substrate having a buried silicon oxide layer (14) in a region at a predetermined depth from one main surface of a silicon substrate (11) except just under both end surfaces of said substrate (11), characterized in that said SOI substrate is free of said oxide layer (14) and an SOI layer (11*a*) formed on said oxide layer (14) just under marking characters (16*a*) attached to an end periphery of said one of said both main surfaces of said substrate for substrate identification.

13. A semiconductor device adopting an SOI substrate as claimed in claim 12.

* * * * *